US010290907B2

(12) United States Patent
Amemiya et al.

(10) Patent No.: US 10,290,907 B2
(45) Date of Patent: May 14, 2019

(54) AUTOMATICALLY PROGRAMMABLE BATTERY PROTECTION SYSTEM AND RELATED METHODS

(71) Applicant: SEMICONDUCTOR COMPONENTS INDUSTRIES, LLC, Phoenix, AZ (US)

(72) Inventors: Keiji Amemiya, Fukaya (JP); Hiroshi Saito, Ota (JP); Mutsuki Niki, Saitama (JP); Yasuaki Hayashi, Oura-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 851 days.

(21) Appl. No.: 14/813,314

(22) Filed: Jul. 30, 2015

(65) Prior Publication Data

US 2017/0033413 A1  Feb. 2, 2017

Related U.S. Application Data

(63) Continuation-in-part of application No. 14/811,973, filed on Jul. 29, 2015, which is a continuation-in-part of application No. 14/809,425, filed on Jul. 27, 2015.

(51) Int. Cl.
*H02J 7/00* (2006.01)
*H01M 10/42* (2006.01)
*H01M 2/34* (2006.01)

(52) U.S. Cl.
CPC ....... *H01M 10/4257* (2013.01); *H01M 2/348* (2013.01); *H02J 7/0031* (2013.01);
(Continued)

(58) Field of Classification Search
CPC ... H01M 10/4257; H01M 2/348; H02J 7/0031
(Continued)

(56) References Cited

U.S. PATENT DOCUMENTS 5,838,076 A   11/1998  Zarrabian
8,896,268 B2  11/2014  Sakurai et al.
(Continued)

FOREIGN PATENT DOCUMENTS

CN   102064585 A   5/2011
CN   102288810 A   12/2011
(Continued)

*Primary Examiner* — Zixuan Zhou
(74) *Attorney, Agent, or Firm* — IPTechLaw

(57) ABSTRACT

A programmable battery protection system. Implementations may include: a battery, only two field effect transistors (FETs), and a battery protection integrated circuit (IC). The battery protection IC may include an array of fuses, first plurality of latches, second plurality of latches, and a comparator. The array of fuses, first plurality of latches, and second plurality of latches may be coupled with a fuse refresh circuit coupled with an analog trigger circuit and a logic trigger circuit. The fuse refresh circuit may be configured to refresh the states of the latches using states of the array of fuses in response to receiving an operating trigger signal generated by the analog trigger circuit or a logic trigger signal generated by the logic trigger circuit. The first plurality of latches may be used to generate a threshold voltage that is provided to the comparator.

13 Claims, 14 Drawing Sheets

(52) U.S. Cl.
CPC .............. *H01M 2010/4271* (2013.01); *H01M 2200/103* (2013.01); *H01M 2220/30* (2013.01); *H02J 2007/004* (2013.01); *H02J 2007/0037* (2013.01); *H02J 2007/0039* (2013.01)

(58) Field of Classification Search
USPC .................. 320/134, 136; 363/41; 307/10.7
See application file for complete search history.

(56) References Cited

U.S. PATENT DOCUMENTS

| | | |
|---|---|---|
| 2003/0099075 A1 | 5/2003 | Pannwitz |
| 2010/0052124 A1 | 3/2010 | Sasaki |
| 2010/0052125 A1 | 3/2010 | Sasaki |
| 2011/0309408 A1 | 12/2011 | Watanabe |
| 2012/0261825 A1 | 10/2012 | Koike |

FOREIGN PATENT DOCUMENTS

| | | | |
|---|---|---|---|
| JP | 2001068614 A | | 3/2001 |
| JP | 2001110986 A | | 4/2001 |
| JP | 2001339869 A | | 12/2001 |
| JP | 2007266218 A | | 10/2007 |
| JP | 2008192959 A | * | 8/2008 |
| JP | 2009131020 A | | 6/2009 |
| JP | 2009283507 A | * | 12/2009 |
| WO | 2010098501 A | | 9/2010 |

\* cited by examiner

FIG. 15A
Power On

| Bit | Q | QN | EXOR |
|---|---|---|---|
| 0 | 0 | 1 | 1 |
| 1 | 0 | 1 | 1 |
| 2 | 0 | 1 | 1 |
| 3 | 0 | 1 | 1 |

FIG. 15B
FUSE Reading (DATA=1011)

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 15C
Noise

| Bit | Q | QN | EXOR |
|---|---|---|---|
| 0 | 1 | 0 | 1 |
| 1 | 0 | 1 | 1 |
| 2 | 0 | 0 | 0 |
| 3 | 1 | 0 | 1 |

FIG. 15D
FUSE Re-reading

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 16A
Power On

| Bit | Q | QN | EXOR |
|---|---|---|---|
| 0 | 0 | 1 | 1 |
| 1 | 0 | 1 | 1 |
| 2 | 0 | 1 | 1 |
| 3 | 0 | 1 | 1 |

FIG. 16B
FUSE Reading (DATA=1011)

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

FIG. 16C
Noise

| Bit | Q | QN | EXOR |
|---|---|---|---|
| 0 | 1 | 0 | 1 |
| 1 | 0 | 1 | 1 |
| 2 | 0 | 1 | 1 |
| 3 | 1 | 0 | 1 |

FIG. 16D
FUSE Re-reading

| Bit | Q | QN | EXOR |
|---|---|---|---|
| 0 | 1 | 0 | 1 |
| 1 | 0 | 1 | 1 |
| 2 | 1 | 0 | 1 |
| 3 | 1 | 0 | 1 |

AUTOMATICALLY PROGRAMMABLE BATTERY PROTECTION SYSTEM AND RELATED METHODS

CROSS REFERENCE TO RELATED APPLICATIONS

This application is a continuation-in-part application of the earlier U.S. Utility Patent Application to Saito, et al. entitled "Automatically Programmable Battery Protection System and Related Methods," application Ser. No. 14/811,973, filed Jul. 29, 2015, now pending, which is a continuation-in-part application of U.S. Utility Patent Application to Saito, et al. entitled "Programmable Battery Protection System and Related Methods," application Ser. No. 14/809,425, filed Jul. 27, 2015, now pending, the disclosures of which are hereby incorporated entirely herein by reference.

BACKGROUND

1. Technical Field

Aspects of this document relate generally to battery systems, such as battery packs for portable electronic devices.

2. Background Art

Battery systems have been devised to allow electronic devices to operate independent of power from a main power supply. Often, these take the form of a battery pack that contains control circuitry for the battery and which includes a set of leads which electrically couple the battery back to the electronic device. Examples of conventional systems and devices may be found in Japan Patent Application Publication No. P2008-192959A to Masanori Kobayashi, entitled "Semiconductor Integrated Circuit," filed Feb. 7, 2007 and published Aug. 21, 2008; Japanese Patent Application Publication No. P2009-131020A to Masatoshi Sugimoto, entitled "Over-Current Protecting Circuit and Battery Pack," filed Nov. 22, 2007 and published Jun. 11, 2009; and Japanese Patent Application Publication No. P2009-283507A to Yamaguchi et al. entitled "Voltage Setting Circuit, Method for Setting Voltage, Secondary Battery Protecting Circuit, and Semiconductor Integrated Circuit Device," filed May 19, 2008 and published Dec. 3, 2009; the disclosures of each of which are hereby incorporated entirely herein by reference.

SUMMARY

Implementations of automatically refreshable programmable battery protection systems may include: a battery, only two field effect transistors (FETs) coupled with the battery, and a battery protection integrated circuit (IC) coupled with the FETs. The battery protection IC may include an array of fuses, a first plurality of latches coupled with the array fuses, a second plurality of latches coupled with the array of fuses, and a comparator coupled with the first plurality of latches. The array of fuses, the first plurality of latches, and the second plurality of latches are coupled with a fuse refresh circuit coupled with an analog trigger circuit and a logic trigger circuit. The fuse refresh circuit may be configured to refresh the states of the first plurality of latches and the second plurality of latches using states of the array of fuses in response to receive one of an operating trigger signal generated by the analog trigger circuit and a logic trigger signal generated by the logic trigger circuit. The first plurality of latches may be used to generate a threshold voltage that is provided to the comparator.

Implementations of automatically refreshable programmable battery protection systems may include one, all, or any of the following:

The fuse refresh circuit may be configured to refresh the states of the first plurality of latches and the second plurality of latches using states of the array of fuses in response to receiving a power on/reset signal from the battery.

The logic trigger circuit may include a plurality of XOR gates coupled with an AND gate coupled with an OR gate, where the OR gate is configured to generate the logic trigger signal to the fuse refresh circuit in response to receiving a first logic trigger signal from the AND gate.

Each of the plurality of XOR gates are coupled with a first latch of the first plurality of latches and a corresponding first dummy latch from the second plurality of latches and is configured to compare a state of the first latch with a state of the first dummy latch and output the result to the AND gate.

If any XOR gate of the plurality of XOR gates returns a null value, the AND gate may generate the first logic trigger signal.

The logic trigger circuit may include a plurality of XOR gates where each of the plurality of XOR gates may be coupled to a first latch and a second immediately adjacent latch of the first plurality of latches, the outputs of the plurality of XOR gates may be coupled to an XOR gate, and the output of the XOR gate may be coupled to a first D flip flop and to an inverter coupled with a second D flip flop. The output of the first D flip flop and the output of the second D flip flop may be coupled with an OR gate coupled to the fuse refresh circuit and the OR gate may be configured to generated the logic trigger signal.

During operation, if the XOR gate outputs a 0, indicating that the comparison of the states of the first plurality of latches by the plurality of XOR gates shows that a sum of the states of the first plurality of latches has changed from an odd number to an even number, the first D flip flop may generate a second logic trigger signal and may output the result to the OR gate which then, in response, generates the logic trigger signal.

The plurality of latches may be gated D latches and the first plurality of latches and the second plurality of latches may be located in separate portions of the battery protection integrated circuit (IC).

The first plurality of latches may be coupled with a plurality of metal oxide field effect transistors (MOSFETs), and the plurality of MOSFETs may be coupled in parallel with a plurality of resistors coupled to the comparator.

Implementations of a battery protection IC may include an array of fuses, a first plurality of latches coupled with the array of fuses, a second plurality of latches coupled with the array of fuses, a comparator coupled with the plurality of latches and with a battery control circuit, and a fuse refresh circuit coupled with a trigger circuit and coupled with the array of fuses, the first plurality of latches, and the second plurality of latches.

Implementations of a battery protection IC may include one, all, or any of the following:

The trigger circuit may include an analog trigger circuit and a logic trigger circuit.

The first plurality of latches may be coupled with a plurality of MOSFETs which are coupled in parallel with a plurality of resistors coupled to the comparator.

The plurality of latches may be gated D latches and the first plurality of latches and second plurality of latches are located in separate portions of the IC.

The logic trigger circuit includes a plurality of XOR gates coupled with an AND gate coupled with an OR gate.

The logic trigger circuit may include a plurality of XOR gates where each of the plurality of XOR gates may be coupled to a first latch and a second immediately adjacent latch of the first plurality of latches, the outputs of the plurality of XOR gates may be coupled to an XOR gate, and the output of the XOR gate may be coupled to a first D flip flop and to an inverter coupled with a second D flip flop.

Implementations of automatically refreshable programmable battery protection systems and battery protection ICs may utilize implementations of a method providing a threshold voltage for a programmable battery protection system. The method may include reading a state of each fuse of an array of fuses into each latch of a first plurality of latches coupled with the array of fuses and into a second plurality of latches coupled with the array of fuses. The method may also include using a state of each latch of the first plurality of latches to open or leave closed a MOSFET of a plurality of MOSFETs, where each of the plurality of MOSFETs may be coupled with each latch of the first plurality of latches, and each MOSFET may be coupled in parallel with a resistor of a plurality of resistors coupled in series. The method may include changing a summed resistance of the plurality of resistors through opening or leaving closed each one of the plurality of MOSFETs. The method may also include using the summed resistance, supplying a generated threshold voltage to a comparator included in a detector, where the detector is coupled with a battery control circuit included in the battery protection IC. The method may also include rereading a state of each fuse of the array of fuses into each latch of the first plurality of latches and into each latch of the second plurality of latches using a fuse refresh circuit in response to receiving an operating trigger signal or a logic trigger signal generated by a trigger circuit coupled with the fuse refresh circuit. The array of fuses, first plurality of latches, and second plurality of latches may be coupled with the fuse refresh circuit.

Implementations of the method of providing a threshold voltage for a programmable battery protection system may include one, all, or any of the following:

The trigger circuit may include an analog trigger circuit and a digital trigger circuit.

The logic trigger circuit may include a plurality of XOR gates coupled with the first plurality of latches and with the second plurality of latches. The plurality of XOR gates may be coupled with an AND gate coupled with an OR gate, where the OR gate may generate the logic trigger signal to the fuse refresh circuit in response to receiving a first logic trigger signal from the AND gate.

The logic trigger circuit may include a plurality of XOR gates where each of the plurality of XOR gates may be coupled to a first latch and a second immediately adjacent latch of the first plurality of latches. The outputs of the plurality of XOR gates may be coupled to an XOR gate. The output of the XOR gate may be coupled to a first D flip flop and the output of the second D flip flop may be coupled with an OR gate coupled to the fuse refresh circuit. The OR gate may be configured to generate the logic trigger signal in response to receiving a second logic trigger signal from the first D flip flop or the second D flip flop.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 14-1 is a circuit diagram of a first portion of another implementation of circuitry included in a battery protection IC;

FIG. 14-2 is a circuit diagram of a second portion of another implementation of circuitry included in a battery protection IC;

FIG. 15A is a table showing the states of the first plurality of latches and states of the second plurality of latches at power on of the battery protection IC;

FIG. 15B is a table showing the states of the first plurality of latches and states of the second plurality of latches after data from the fuse array has been read into the corresponding latches of the first plurality of latches and second plurality of latches of the battery protection IC;

FIG. 15C is a table showing an altered latch resulting from noise and the corresponding resulting change in EXOR (XOR) gate state;

FIG. 15D is a table showing the states of the first plurality of latches and states of the second plurality of latches after data from the fuse array has been reread into the corresponding latches of the first plurality of latches and second plurality of latches of the battery protection IC in response to a logic trigger signal from a trigger circuit;

FIG. 16A is a table showing the states of the first plurality of latches and states of the second plurality of latches at power on of the battery protection IC;

FIG. 16B is a table showing the states of the first plurality of latches and states of the second plurality of latches after data from the fuse array has been read into the corresponding latches of the first plurality of latches and second plurality of latches of the battery protection IC;

FIG. 16C is a table showing two altered latches resulting from noise and the corresponding unchanged EXOR (XOR) gate state;

FIG. 16D is a table showing the states of the first plurality of latches and states of the second plurality of latches after data from the fuse array has been reread into the corresponding latches of the first plurality of latches and second plurality of latches of the battery protection IC in response to a logic trigger signal from a trigger circuit.

DESCRIPTION

This disclosure, its aspects and implementations, are not limited to the specific components, assembly procedures or method elements disclosed herein. Many additional components, assembly procedures and/or method elements known in the art consistent with the intended programmable battery protection systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such programmable battery protection systems, and implementing components and methods, consistent with the intended operation and methods.

Figure 3:
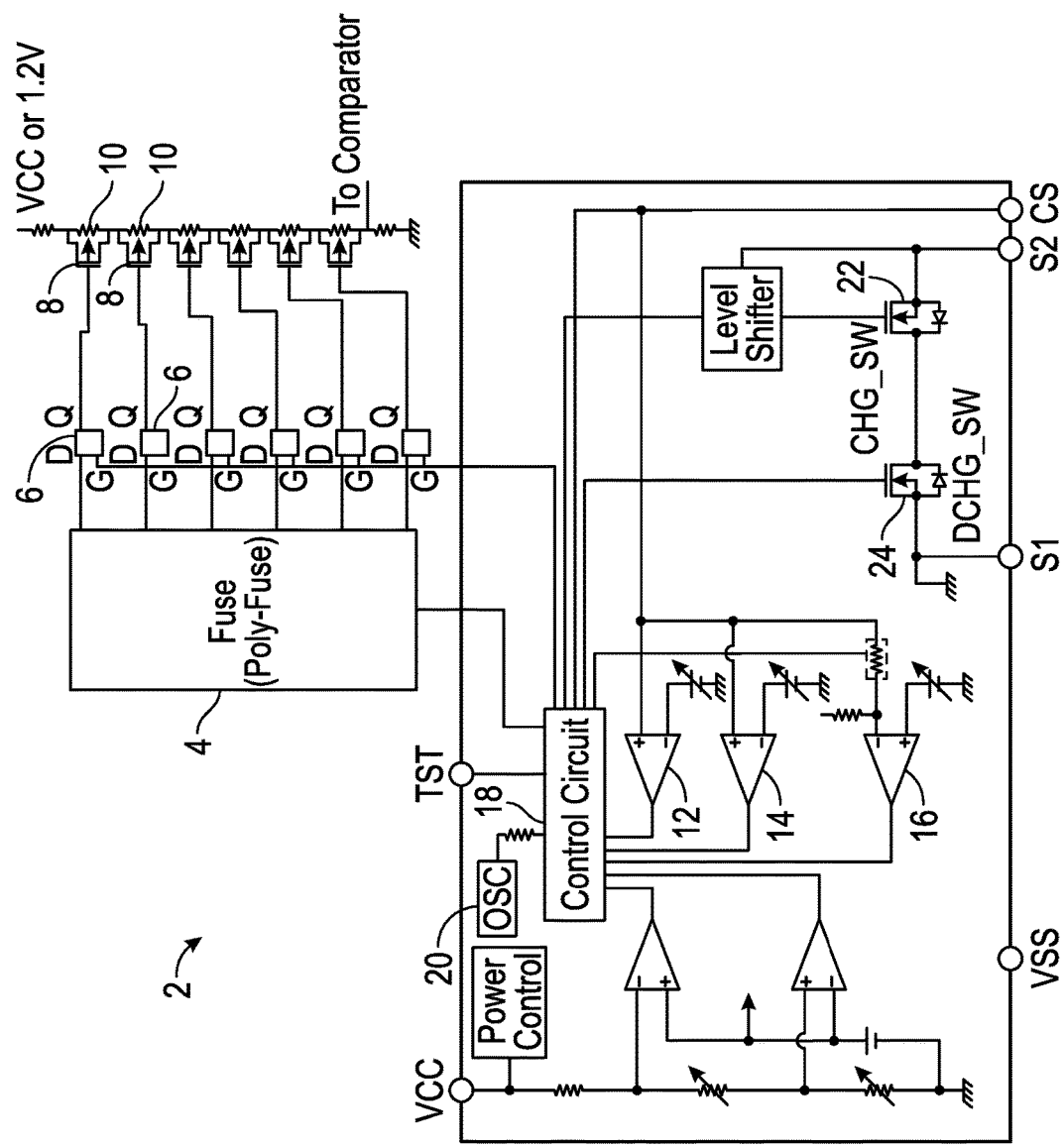
FIG. 3 is a circuit and block diagram view of a battery protection circuit included in a battery protection IC and included internal and external field effect transistors (FETs)

Referring to FIG. 3, an implementation of a battery control circuit 2 for use in a programmable battery protection system is illustrated. As illustrated, the battery control circuit 2 includes an array of fuses 4 coupled with a plurality of latches 6, and with a plurality of p-channel metal oxide semiconductor field effect transistors (MOSFETs) 8. The plurality of p-channel MOSFETs are each individually wired in parallel with a corresponding resistor 10 of a plurality of resistors that are coupled together in series. The output of the plurality of resistors is received by a comparator 12, 14, 16 and is the threshold (reference) voltage supplied to the comparator.

During operation, a voltage such as a bandgap voltage of about 1.2 V or the entire supply voltage from the battery is fed into the plurality of resistors 10. Based on whether the corresponding MOSFET 8 is open or closed, the current flows through the MOSFET 8. When current flows through the MOSFETs 8, this determines the ultimate summed resistance of the plurality of resistors 10 taking into account the rise and/or fall voltage characteristics of the MOSFETs 8. This summed resistance, in turn, according to Ohm's law, determines the final voltage output to the comparator 12, 14, 16, which is used by the comparator as a threshold (reference) voltage. Whether a particular p-channel MOSFET 8 is open or closed depends on whether a positive gate voltage is applied to the gate by a latch 6 of the plurality of latches.

Whether each latch 6 has a stored voltage signal or the absence thereof is determined by whether the particular fuse 4 coupled to each latch is open or closed. In this way, as the latches 6, by design, are capable of maintain a voltage signal on the gates of the MOSFETs, the state (open/closed) of the fuses 4 need only be read once into the latches in various implementations. In various implementations, signals from an oscillator or clock 20 coupled to the battery control circuit 18 may be used to maintain the state of each of the plurality of latches 6 read from the fuse array 4.

Through the structure of the circuit illustrated in FIG. 3, the collective state of the array of fuses 4 can be used to encode a summed resistance value of the plurality of resistors 10, and, correspondingly, the threshold voltage applied to the comparator 12, 14, 16. Since each fuse 4 has only two states (open/closed) the array of fuses can be used to encode a binary value. In various implementations, this binary value stored in the fuse array 4 may initially be sent to the fuse array in serial form in the form of a trimming signal (fuse trimming signal), and additional circuitry may be employed to deserialize the data and assign it to the appropriate fuse for use in the trimming process. In so doing, the threshold voltage needed for the comparator may be effectively encoded in the array of fuses once the fuses have been trimmed by the trimming signal. The trimming signal is sent to the array of fuses from a battery control circuit 18 coupled to the fuse array 4.

A wide variety of circuit implementations and circuit component implementations are possible. In the implementation illustrated in FIG. 3, the plurality of latches are all gated D latches. In other implementations, however, other latch types could be employed, including, by non-limiting example, Earle latches, D flip-flops, JK flip-flops, gated SR latches, and any other latch type capable of holding a voltage on the gate of a MOSFET, including edge triggered latches. While p-channel MOSFETs are illustrated, n-channel or other MOSFET types could be used in various implementations. While the plurality of resistors are all illustrated as being arranged in series with the output of the comparator, in other implementations, one or more of the resistors could be arranged in parallel with the output to the comparator, creating a voltage divider circuit. The array of fuses can take several forms. In particular implementations, each fuse may be a polyfuse including of polysilicon. In various implementations, any of the fuse implementations disclosed in Japanese Patent Application Publication No. P2009-283507A to Yamaguchi et al. previously incorporated by reference, may be used in various implementations. Any number of two or more fuses in an array may be employed in various implementations. The array of fuses may form a programmable read only memory (PROM). In various implementations, the array of fuses may form a one-time programmable (OTP) memory.

The comparator 12, 14, 16 is part of or is a detector circuit that is used to detect an operating condition of a battery to which the battery protection system is coupled. In various implementations, the operating condition to be detected is an undesirable one, such as a battery discharge overcurrent condition, a battery charge overcurrent condition, or a battery short-circuit condition. Some of these conditions may damage the battery or create safety risks, particularly where the battery uses lithium ion technology. In various implementations, the voltage supplied to the comparator 12, 14, 16 is designed to allow the detector circuit to detect, one, all, or any of these conditions. In particular implementations, a separate detector circuit may be used to detect each of these conditions and send a detection signal to a battery control circuit that is capable of separating/breaking the connection between the battery and a load or charger (depending on the way the system is arranged) to prevent damage to the battery, load, charger, or all of these.

In various implementations, the same threshold voltage value may be supplied to all of the comparators 12, 14, 16 in the various detector circuits. In such implementations, only one array of fuses is needed, as the threshold voltage signal created by the latches, MOSFETs, and resistors can be provided for each comparator in each detector circuit. In other implementations, however, one or more of the detectors may require different threshold voltage from the others. In such implementations, more than one array of fuses may be employed. In other implementations, a single array of fuses may still be used but two or more sets of latches and two or more corresponding sets of resistors may be used to create two or more threshold voltages by reading out the states of different portions of the array of fuses into each set of latches.

The value of the threshold voltage may, in various implementations, be a strong function of one or more of the components in the battery protection integrated circuit 2. In the implementation illustrated in FIG. 3, the operating characteristics of the charging field effect transistor (FET) 22 and discharging FET 24, such as the on-resistance of either or both the charging FET and discharging FET, are the parameters that can be used to calculate the appropriate threshold voltage that corresponds with the existence of a discharge overcurrent, a charge overcurrent, or a short-circuit current being drawn from or input into the battery. In the system illustrated in FIG. 3, the charging and discharging FETs 22, 24 control the flow of current into and out of the battery itself, and so monitoring the inputs/output behavior of these devices permits the battery protection IC 2 to ensure that the undesirable condition does not exist. In particular implementations, both the charging and discharging FETs 22, 24 are activated during charging and discharging of the battery pack. In such implementations, an abnormal condition exists and would need to be detected by the detection circuits if only the charging FET 22 activated or if only the discharging FET 24 activated during charging or discharging. However, in other implementations, only the charging FET 22 may be activated during charging and the discharging FET 24 may be activated during discharging.

If the particular on resistances of the actual physical charging FET 22 and FET 24 in the battery protection IC 2 are known, then the threshold voltage(s) can be calculated given the particular over-discharge/over-discharge/short current specifications for the battery using various relationships, such as resistivity models or Ohm's law. Once these threshold voltage(s) have been calculated, the needed summed resistance to produce this voltage for of the plurality of resistors can be calculated with information regarding the available supply current and any relevant operating characteristics of the plurality of MOSFETs. For example, if the discharge overcurrent is 5 A, and the on resistance of both the discharge and charging FET is 10 milliohms, then, using Ohm's law, the discharge overcurrent threshold voltage would be 50 millivolts. Similarly, for the same discharge current of 5 A, on resistances of both the discharge and charging FET of 12 milliohms and 14 milliohms result in discharge overcurrent threshold voltages of 60 millivolts and 70 millivolts, respectively.

Using known values for the charge overcurrent, the discharge overcurrent, the shorting current, and the on-resistance of the charging FET/discharging FET or both the charging FET and discharging FET, the values of the charge overcurrent threshold voltage, the discharge overcurrent threshold voltage, and the short threshold voltage can be calculated. Additional comparators 16 and 14, respectively, receive these threshold voltages and feed a detection signal to the battery protection circuit 18. As previously discussed, if these threshold voltages differ from each other, then an additional fuse array and set of resistors may be employed (or multiple sets of latches/MOSFETs/resistors with a single fuse array).

Figure 4:
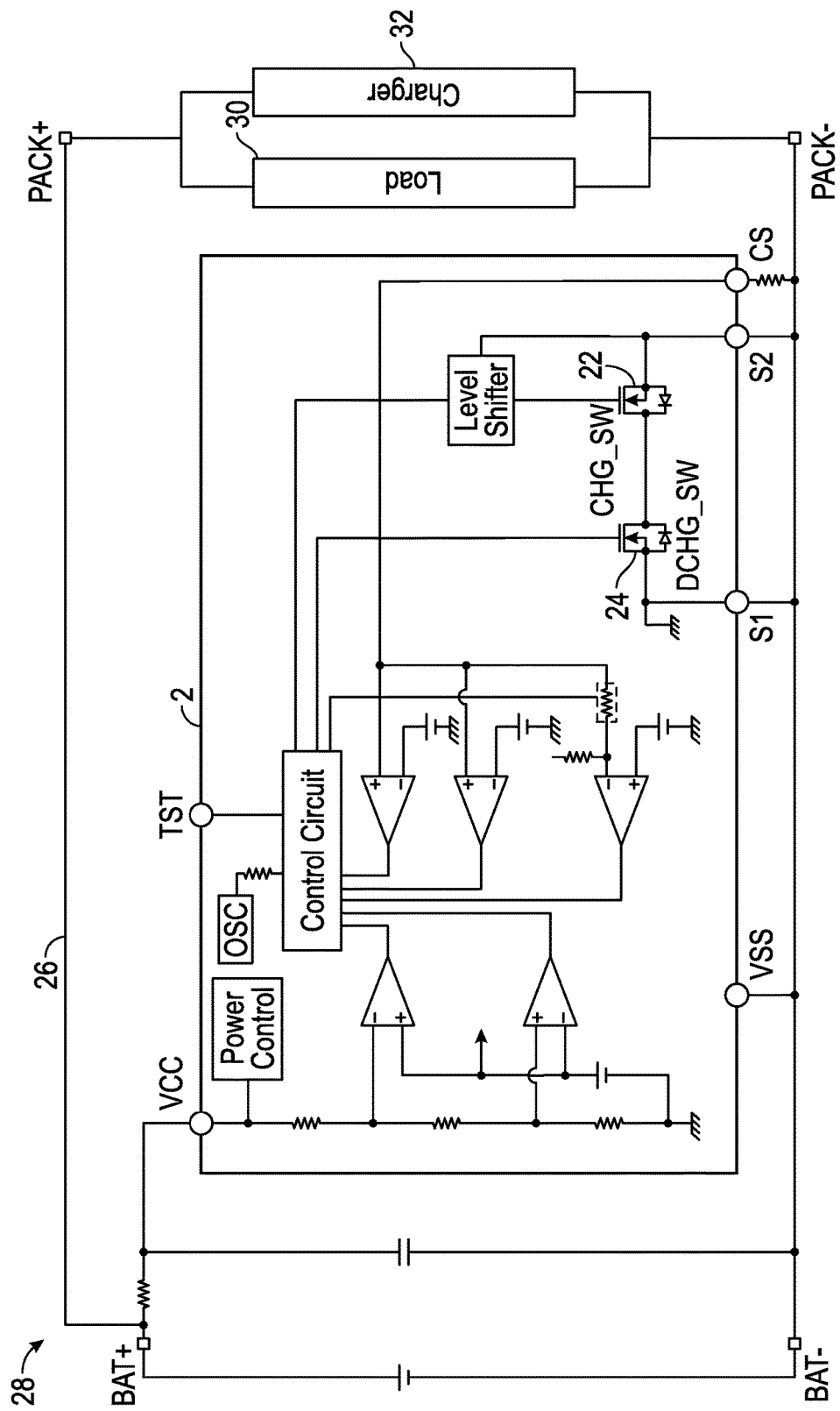
FIG. 4 is a circuit and block diagram of a battery and battery pack connected to a load and to a charger.

Referring to FIG. 4, during use, the battery protection IC 2 is incorporated into a battery pack 26 of a portable electronic device system 28. As illustrated, the system 28 can, at various times, include a load 30 and a charger 32. Depending on the characteristics of load 30, the charger 32 may be used concurrently with the load 30 or the load 30 and the charger 32 may be mutually exclusively used with the battery pack 26. The discharge FET 24 and the charging FET 22 are used to supply voltage and current to the load 30 and to receive voltage and current from the charger 32. Conventional battery pack systems have the discharge FET 24 and charging FET 22 mounted by themselves to a circuit board which contains contacts on a back side of the board that contact the battery cell(s) itself and contacts on a front side of the board that are designed to contact the load/charger. In particular implementations of battery protection ICs disclosed herein, the discharge FET 24 and the charging FET 22 may be included in the same semiconductor package and mounted at one location on the board of the battery pack 28.

Figure 1:
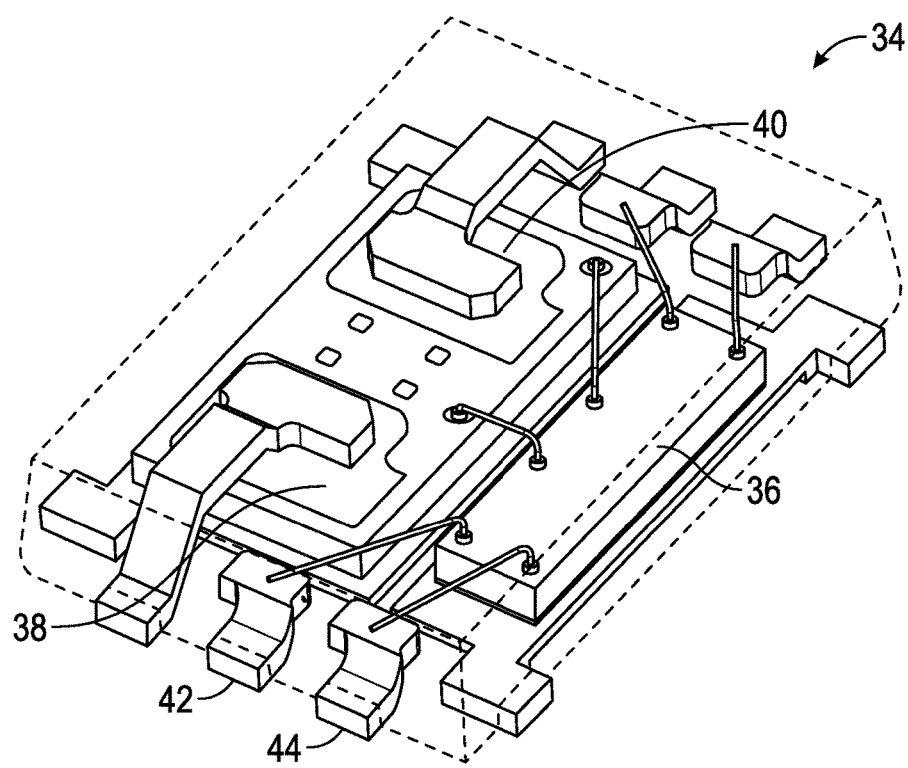
FIG. 1 is a see through view of a battery protection integrated circuit (IC)

Referring to FIG. 1, an implementation of a battery protection package 34 is illustrated. As illustrated, the mold compound of the package 34 is shown in see through so that the internal structure of the package 34 can be seen. As illustrated, a battery protection IC 36, the charging FET 40 and the discharge FET 38 are all included in the same package 34. While the battery protection IC 36 and the FETs 38, 40 have leadframes that are electrically isolated, the two chips are wire bonded together within the package 34 to allow the battery protection IC 36 to still control the operation of the FETs 38, 40. Various pins/leads may be included in the package 34 that electrically couple with the battery protection IC 36, including a current sense and testing pin 42 and a test (testing) pin 44. These pins interact with the board of the battery pack system. As can also be observed, the charging FET 40 and the discharge FET 38 are on the same chip, and were manufactured together on the same wafer. Accordingly, their on resistances may be very close in value to each other.

While FIG. 1 illustrates the battery protection IC 36 included in the same package as the charging and discharging FETs 40, 38, they could in various implementations be included in different packages as well.

Conventionally, the on resistance of the charging and discharging FETs used in battery packs is assumed to be exactly at the design specification. It has been discovered that the actual range of values on resistances of actual devices is in the range of 9.6 milliohms to 15.6 milliohms when a supply voltage of 3.7 V has been applied and the temperature of the devices is 25 C. This variation of about +/−25% of the midpoint of the range affects the ability of conventional detection circuitry to detect an overcurrent or short condition if the threshold voltages have been calculated using merely the design specification on resistance. This problem becomes particularly acute when the discharge current threshold voltage, charging current threshold voltage, and short current threshold voltage are a constant voltage value.

Figure 2:
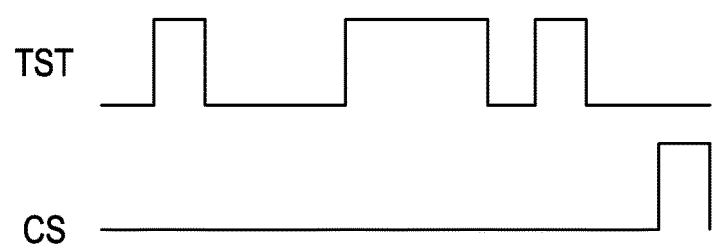
FIG. 2 is a diagram of a testing signal used to input trimming data to an array of fuses.

Implementations of battery protection ICs like those disclosed herein may utilize implementations of a method of providing a threshold (reference) voltage for a programmable battery protection system. Implementations of the method include, during application of a testing signal, measuring the on resistance of the charging FET and/or discharging FET and/or both the charging FET and discharging FET and calculating a threshold voltage using the on resistance using the battery protection circuit. The processing of calculating the threshold voltage may be any of those disclosed in this document and the threshold voltage may be any disclosed herein. With the calculated threshold voltage value, the battery protection circuit generates a fuse trimming signal and sends the fuse trimming signal to the array of fuses. Referring to FIG. 2, a graph of a testing signal (TST) and another testing signal (CS). As shown in FIG. 2, after measurement of the on resistance of a FET has been made, the testing signal (TST, CS) is used to convey the trimming signal to the fuse array. The fuse trimming signal is then used to open and leave closed those fuses corresponding with the received data in the trimming signal. These open and closed fused then change the comparator(s) threshold voltage(s) as described herein. The CS signal is used as an enable signal for the testing signal. The TST signal contains the serialized data used to trim the fuses. The CS pin is also used in various implementations for current sense signal detection while, in implementations, the TST pin has no further use during operation of the package after fuse trimming is completed.

The latches, using the clocking signal provided by the oscillator in various implementations, then read a state (open/closed) from each fuse and either change their state or remain closed as a result. A voltage is then applied to the gates of the plurality of MOSFETs that is a function of the states of the latches. The final summed resistance of the plurality of resistors is then established through the opening/closing of the various MOSFETs. The summed resistance is then used to supply the generated threshold voltage to a comparator included in a detector (detector circuit) and used as described herein. In the event the detector detects a deviation from the threshold voltage, a detection signal is sent to the battery protection circuit which takes action by separating a connection between the battery and the load and/or charger as needed to protect the battery.

Various method implementations permit the threshold voltage to be calculated at the time the battery pack is assembled and being prepared for shipping through measuring the actual on resistance of the charging and discharging FETs during a testing process. Since this is done after final assembly, the most accurate threshold voltage for each FET may be calculated. This threshold voltage generated during testing is based on the as-packaged and as-finally built values and will allow the battery protection IC to most accurately detect when a problem situation exists.

As disclosed herein, the method of programming or trimming the array of fuses takes place only once during the testing of the battery pack. Because the fuse array is a single write array (the fuses physically cannot be reclosed after being opened), it is not possible to reprogram or retrim the array of fuses after they have received the trimming signal.

Results of a comparison of conventional methods and systems for using the on resistance of the FET to control the battery pack performance and the systems and methods disclosed herein may be found in Table 1 below:

TABLE 1

| Parameter | Condition | Disclosed System | Conventional System |
|---|---|---|---|
| Total Impedance | — | 11 milliohms | 10.1 milliohms |
| Overcurrent Comparator Reference | — | Variable Voltage Capable | Constant Voltage Only |
| Current Monitoring | Discharge Overcurrent = 6.9 A | 6.2 A to 7.6 A (Δ = 1.4 A). | 5.1 A to 10.7 A (Δ = 5.6 A) |
| Discharge Current | Max Allowed | 7.6 A | 10.7 A |
| Discharge Current | Min Allowed | 6.2 A | 5.1 A |

By inspection it is clear that implementations of programmable battery protection systems like those disclosed herein can provide several times better detection and performance may keep the battery pack operating much closer to design current specifications. This may reduce damage short term and long term to the battery pack and may better ensure safe operation of the pack. The heat generated by operation at 10.7 A, for example, over the long term may damage and/or potentially create a hazardous condition with the battery pack if the battery protection system is unable to detect the condition.

Figure 5:
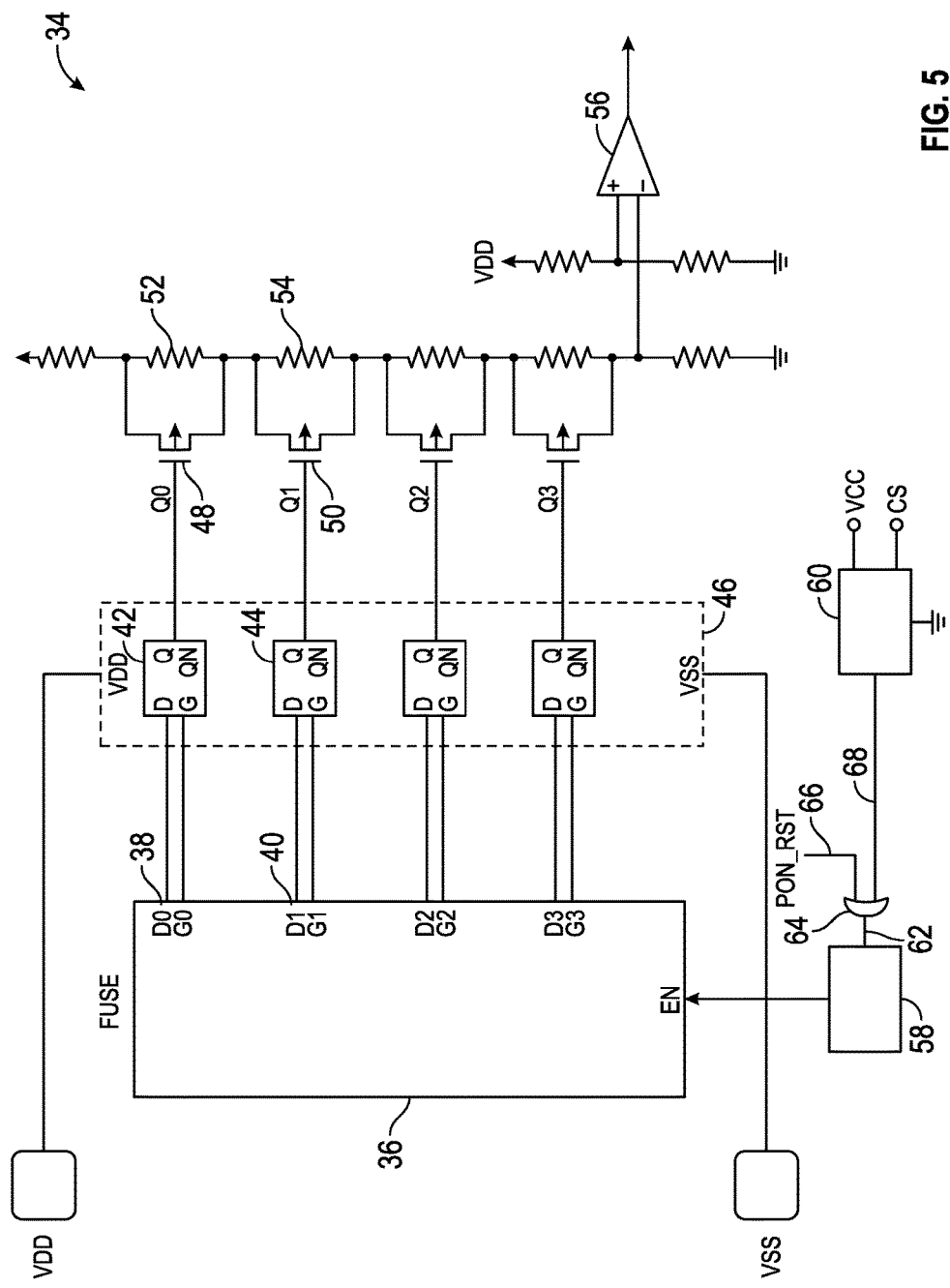
FIG. 5 is a circuit and block diagram of a fuse array, a fuse refresh circuit, and a trigger circuit.

Referring to FIG. 5, an implementation of circuitry 34 for an automatically refreshable programmable battery protection system is illustrated. As illustrated, the circuitry 34 includes a fuse array 36 where each fuse 38, 40 in the array 36 is coupled with a corresponding latch 42, 44 of a plurality of latches 46. Because of the structure of the latches 46, the state of each fuse 38, 40 is used to set a state of each corresponding latch 42, 44. In various implementations, the array of fuses 36 may be any type of fuse disclosed in this document and the latches may be any type of latch disclosed herein. As illustrated, the plurality of latches 46 are coupled with a plurality of MOSFETs 48, 50 which are coupled in parallel with a plurality of resistors 52, 54. The plurality of MOSFETs 48, 50 and resistors 52, 54 operate similarly as described herein to create a summed resistance which is used to generate a threshold voltage which is sent to a comparator 56 for use in detecting discharge overcurrent values, charge overcurrent values, and short current values as described herein.

The fuse array 36 is coupled with a fuse refresh circuit 58 which is coupled with a trigger circuit 60. A trigger signal 62 is formed by using an OR logic gate 64 to join a power on/reset signal 66 from a battery with an operating trigger signal 68 from the trigger circuit 60. As illustrated, the trigger circuit 60 is connected to a supply voltage (Vcc) and current sense (CS) signals to aid it in generating the operating trigger signal 68 as will be described in more detail herein.

Figure 10:
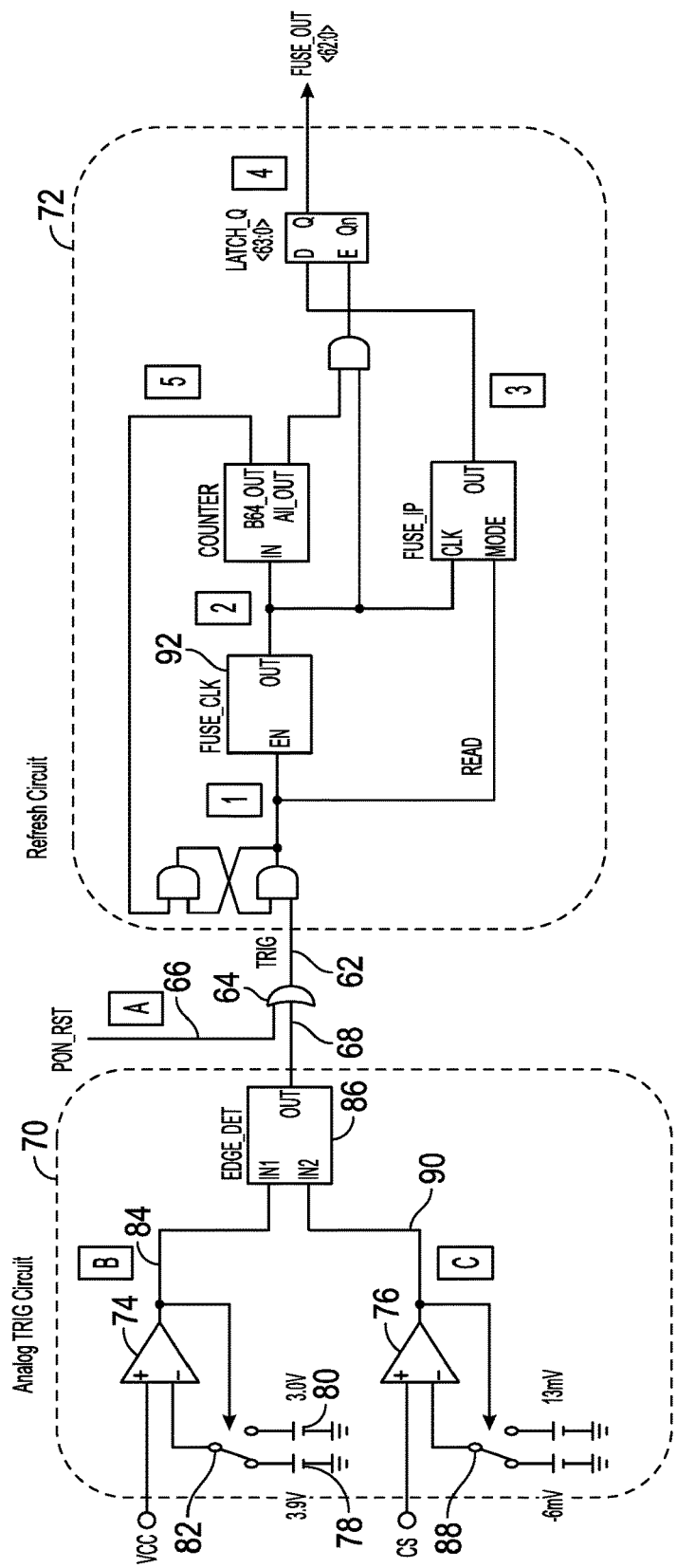
FIG. 10 is a circuit diagram of an implementation of a trigger circuit and an implementation of a refresh circuit including a latch.

Referring to FIG. 10, an implementation of a trigger circuit 70 and fuse refresh circuit 72 are illustrated. As illustrated, the trigger circuit 70 includes two comparators, a supply voltage comparator 74 and a current sense comparator 76. As illustrated, two reference voltages, one used for over charge voltage fuse refresh 78 and one used for over discharge voltage fuse refresh 80 are supplied to the supply voltage comparator 74 through switch 82. Whether the overcharge voltage fuse refresh reference voltage 78 or over discharge voltage fuse refresh reference voltage 80 is supplied to the comparator 74 is determined by the position of the switch 82. The switch 82 uses the supply voltage trigger signal 84 from the comparator 74 to determine its position. As illustrated, in the implementation of FIG. 10, the overcharge voltage fuse refresh reference voltage is 3.9 V and the over discharge voltage fuse refresh reference voltage is 3.0 V. When the supply voltage value is greater than 3.9 V during a charging cycle, the supply voltage trigger signal 84 from the comparator 74 swings to a logical 1 (or 0 in particular implementations). When this occurs, the switch 82 changes position to apply the discharge voltage fuse refresh reference voltage to the comparator 74. The change from logical 1 to logical 0 in the supply voltage trigger signal 84 is detected by edge detector 86 which then outputs the operating trigger signal 68 when the change is detected.

The current sense comparator 76 operates in similar fashion, as it includes a switch 88 which changes position in response to the swing of the current sense trigger signal 90 from logical 1 to logical 0, and vice versa. This will happen when a system overcharge current condition or system over discharge current condition are detected (and vice versa, depending on how the comparator is set up). The edge detector 86 likewise detects the swing of the current sense trigger signal 90 from logical 1 to logical 0 (and vice versa) and outputs the operating trigger signal 68 in response to detection of the shift.

OR logic gate 64 receives the operating trigger signal 68 and the power on/reset signal 66 from the battery and outputs trigger signal 62 (TRIG) to the fuse refresh circuit 72. Since the OR logic gate 64 is an OR gate, it outputs the trigger signal 62 whether either the operating trigger signal 68 or the power on/reset signal 66 is received. The structure of the fuse refresh circuit 72, in response to receiving the trigger signal 62, uses a fuse clock 92 to read each state of the plurality of fuses in the fuse array to each corresponding latch, thereby refreshing the states of the plurality of latches using the states of the plurality of fuses. As illustrated in FIG. 10, the fuse array is a 64 bit array, so 64 fuses are included, 1 per bit, which can then be coupled to up to 64 corresponding latches. More fuses or fewer fuses may be included in various implementations, depending on the number of bits of data desired to establish the needed summed resistance for threshold voltage generation.

Figure 7:
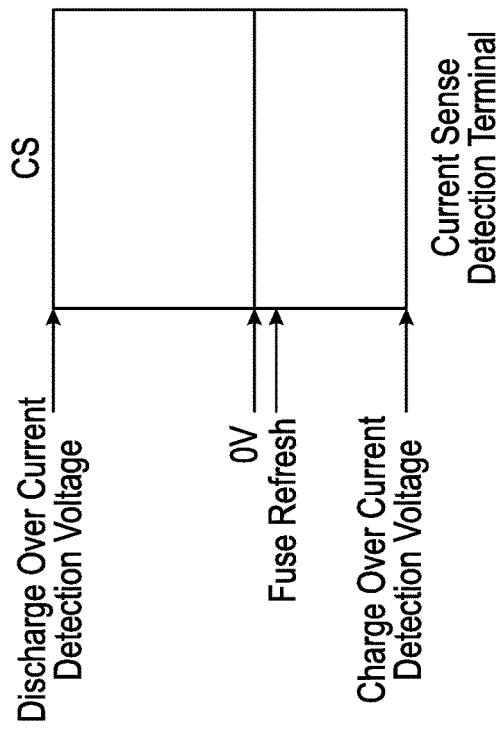
FIG. 7 is a diagram of a current sense value detected at a current sense detection terminal showing a discharge over current detection voltage, a charge over current detection voltage, and a fuse refresh level between these two points.
Figure 6:
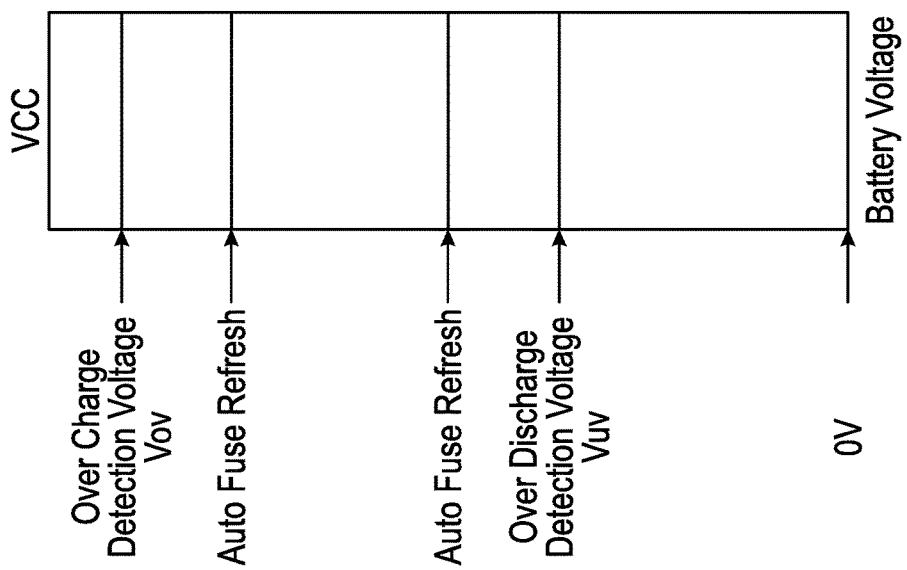
FIG. 6 is a diagram of a supply voltage showing the over charge detection voltage, over discharge detection voltage, and auto fuse refresh voltage levels between these two voltages.

Referring to FIGS. 6 and 7, FIG. 6 is a diagram of a supply voltage showing the overcharge detection voltage, over discharge detection voltage, and auto fuse refresh voltage levels between these two voltages. FIG. 7 is a diagram of a current sense value detected at a current sense detection terminal showing a discharge over current detection voltage, a charge over current detection voltage, and a fuse refresh level between these two points. These diagrams demonstrate that for the supply voltage Vcc, two different voltage levels labeled Auto Fuse Refresh are selected (predetermined) which are located below the overcharge detection voltage and above the over discharge detection voltage for the purpose of refreshing the latches from the fuses before either of the detection voltages are reached. These voltage levels correspond with the overcharge voltage fuse refresh 78 or over discharge voltage fuse refresh reference voltage 80 previously discussed.

Figure 8:
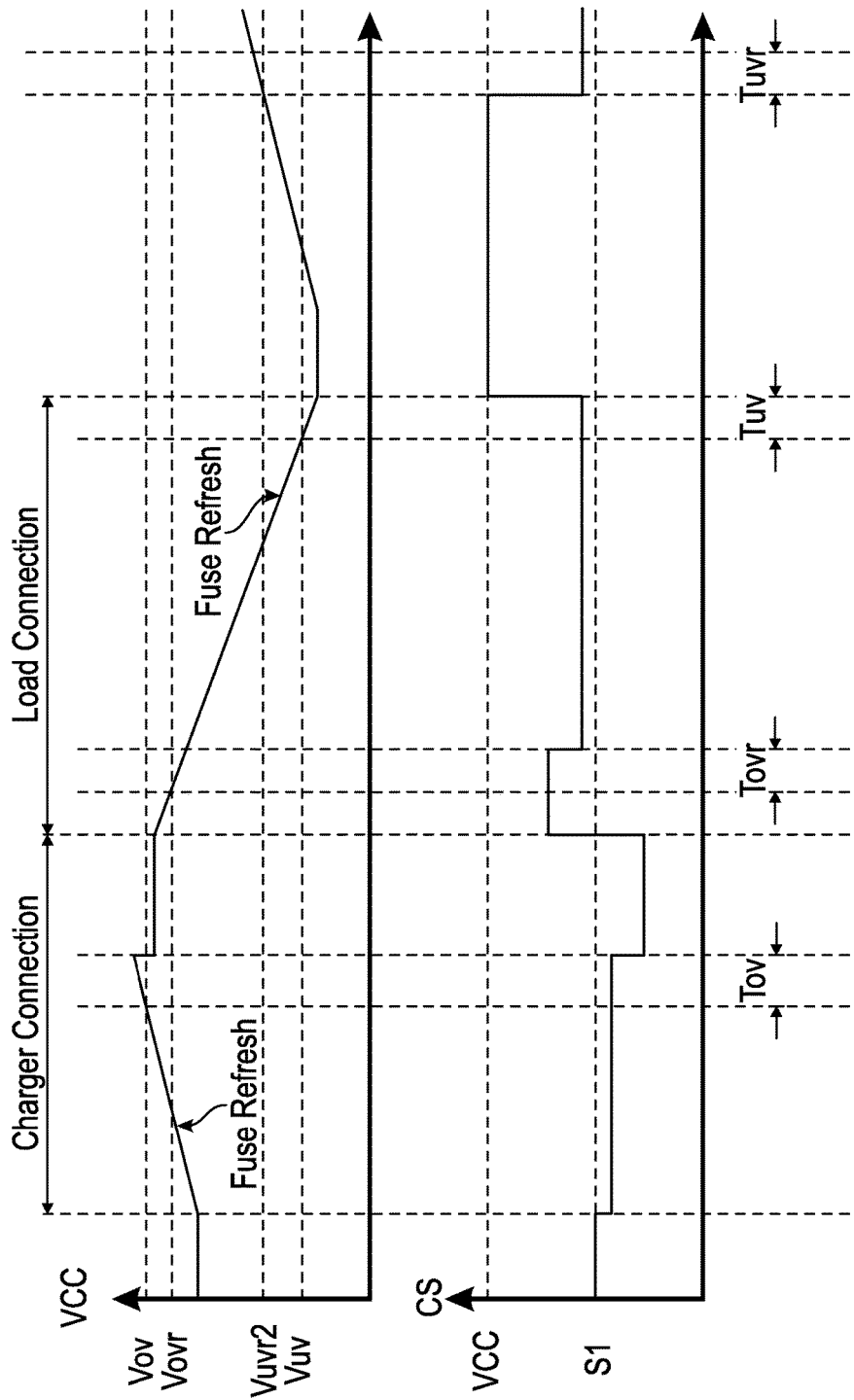
FIG. 8 is a graph of supply voltage (Vcc) and current sense (CS) over time showing the automatic fuse refresh points in response to a supply voltage trigger signal generated by the trigger circuit.

The purpose of selecting the voltage levels both below and above these levels can be observed in FIG. 8, which shows a graph of supply voltage over time and a corresponding graph of current sense signal over time. As illustrated, at the time when the charger is connected with the battery, the supply voltage level begins to rise toward its target maximum (the overcharge detection voltage). The auto fuse refresh voltage may be selected so that it is reached during the rise of the supply voltage during charging at a point in time to provide sufficient time for the fuse refreshing of the latches to be completed so as to ensure the desired threshold voltage is supplied to the detector circuits providing input to the battery control circuit included in the battery protection IC. As can be seen, after the fuses are refreshed, the detector circuits (using the comparators and the threshold voltage supplied), detect the existence of an overcharge voltage condition (Vov) and then the battery control circuit disconnects the battery from the charger, stopping the charging process, and retaining the battery at its fully charged supply voltage condition.

A similar process occurs when a load is applied to the battery. As can be seen from FIG. 8, the available supply voltage from the battery decreases over time until the auto fuse refresh voltage is reached, which results in a trigger signal being sent to the fuse refresh circuit, when then refreshes the latches with the fuse data. The auto fuse refresh voltage value may be similarly set so that the fuse refresh process can be accomplished in sufficient time before the load discharges the battery to reach the over discharge voltage detection voltage level (Vuv). The foregoing assumes that the load will continue draw power from the battery at the same consumption rate at the time the auto fuse refresh voltage level was reached. While this may not occur in all situations, it represents an implementation of a safety practice, that as the battery approaches the overcharge or over discharge voltage levels, the fuse data is refreshed into the latches.

The importance of being able to refresh the states of the plurality of latches (and thereby the threshold voltage(s) of the detector circuits) is that it may permit the battery protection IC to ensure the battery operates within safe operating ranges. This is even if the states of one or more of the plurality of latches are altered by noise or other interference that changes the state of one or more of the plurality of latches. For example, if the latch was designed to hold a 1, but through noise interference, the value became a 0, the resulting summed resistance (via the corresponding MOSFET and resistor) would result in an incorrect threshold voltage. Also, if the latch was placed in a metastable state in which it was able to properly store/communicate/settle to either a 1 or 0 state as a result of the noise, the effect on the summed resistance and threshold voltage would be similar. Being able to automatically refresh the plurality of latches with fuse data at points during operation of the battery where the threshold voltage values are important to have accurately communicated may mitigate any noise risks involved in using latches to store the fuse states. It may also reduce power consumption caused by the reading of the fuse values more often than needed to ensure the proper latch values are in place at particular operating battery conditions.

The risks associated with operating with incorrect latch values (and correspondingly, incorrect threshold values) are not insignificant. If the threshold voltage value is incorrect and allows the battery to overcharge, it may explode. If the threshold voltage value is incorrect and allows the battery to over discharge, a hazardous condition may be created in the battery cell as copper from the contacts and other structure of the cell may be drawn into the lithium ion portion of the cell, which could cause a fire (for lithium ion battery types). Use of the automatic refreshing capabilities of the latches may accordingly mitigate risks associated with using latches relating to interference from noise and external forces that could negatively impact safety and other performance.

Figure 9:
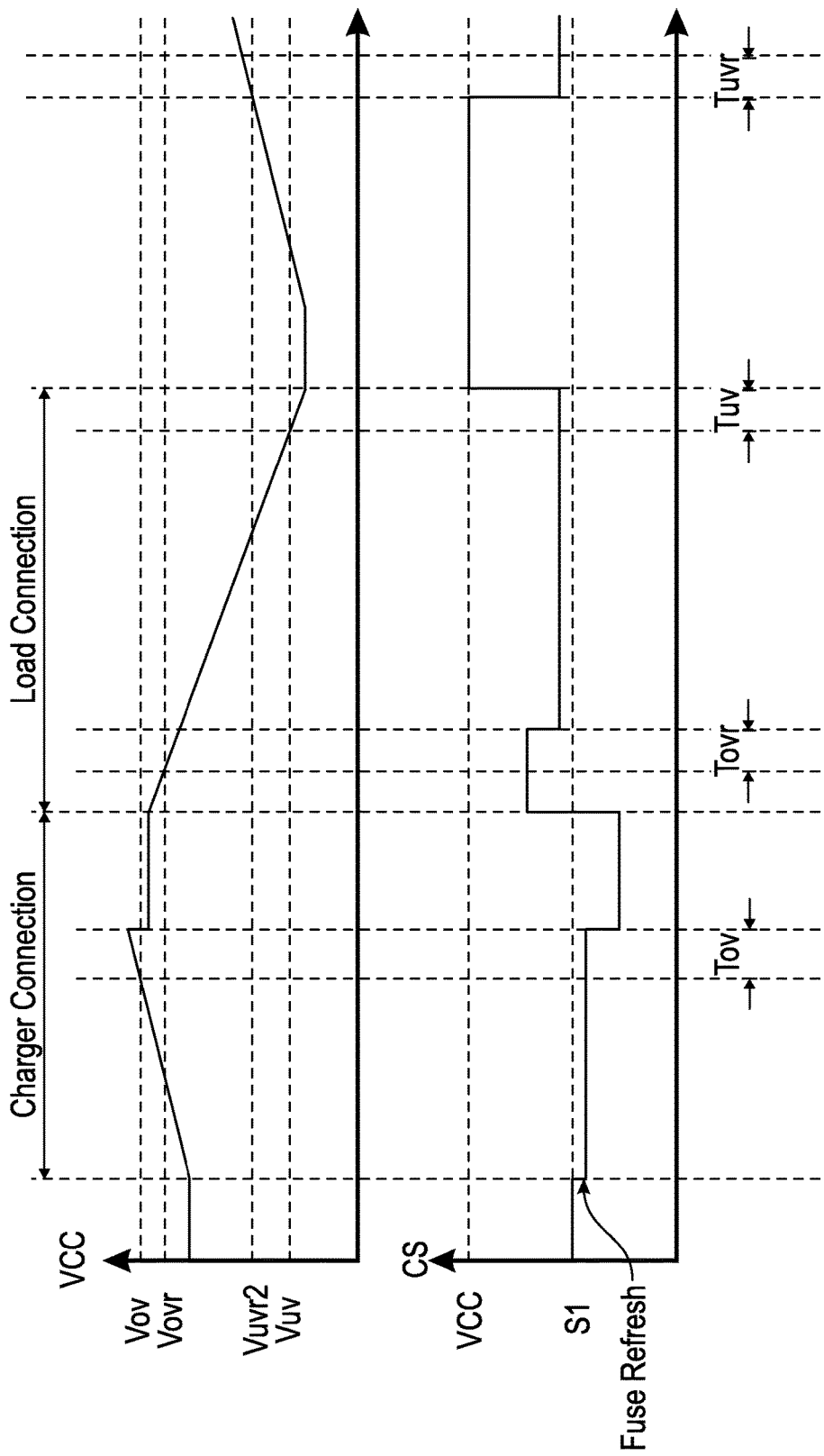
FIG. 9 is a graph of supply voltage (Vcc) and current sense (CS) over time showing the automatic fuse refresh points in response to a current sense trigger signal generated by the trigger circuit.

Referring to FIGS. 7 and 9, the fuse refreshing behavior of the system based on the current sense signal is illustrated. As illustrated in FIG. 7, a fuse refresh voltage level below 0 V is established that is above a charge over detection voltage based on the current sense signal. In various implementations, another fuse refresh voltage level above 0 V may be established to handle situations where the discharge over current detection voltage is being approached. This fuse refresh voltage level is represented in FIG. 10 as the bottom level (−6 mV) of the switch 88 that inputs to the comparator 76 for the current sense signal. Because both the supply voltage trigger signal 84 and the current sense trigger signal 90 are detected by the edge detector 86, changes in either of them will trigger generation of the operating trigger signal 68. Accordingly, both changes in supply voltage and the current sense signal can result in fuse refreshing of the plurality of latches. FIG. 9 illustrates how, at the time the battery is first connected to the charger, an immediate reversal of the current flow to the battery results which is sensed as a negative current sense voltage signal. Since this negative voltage is less than the fuse refresh voltage value illustrated in FIG. 7, it triggers a refreshing of the states of the plurality of latches from the array of fuses to ensure that the proper threshold voltage values are present at the beginning of the charging cycle. In this way, the current sense and supply voltage are used complimentarily to provide proactive updating of the stored values in the plurality of latches at predefined operating points of the battery.

Figure 11:
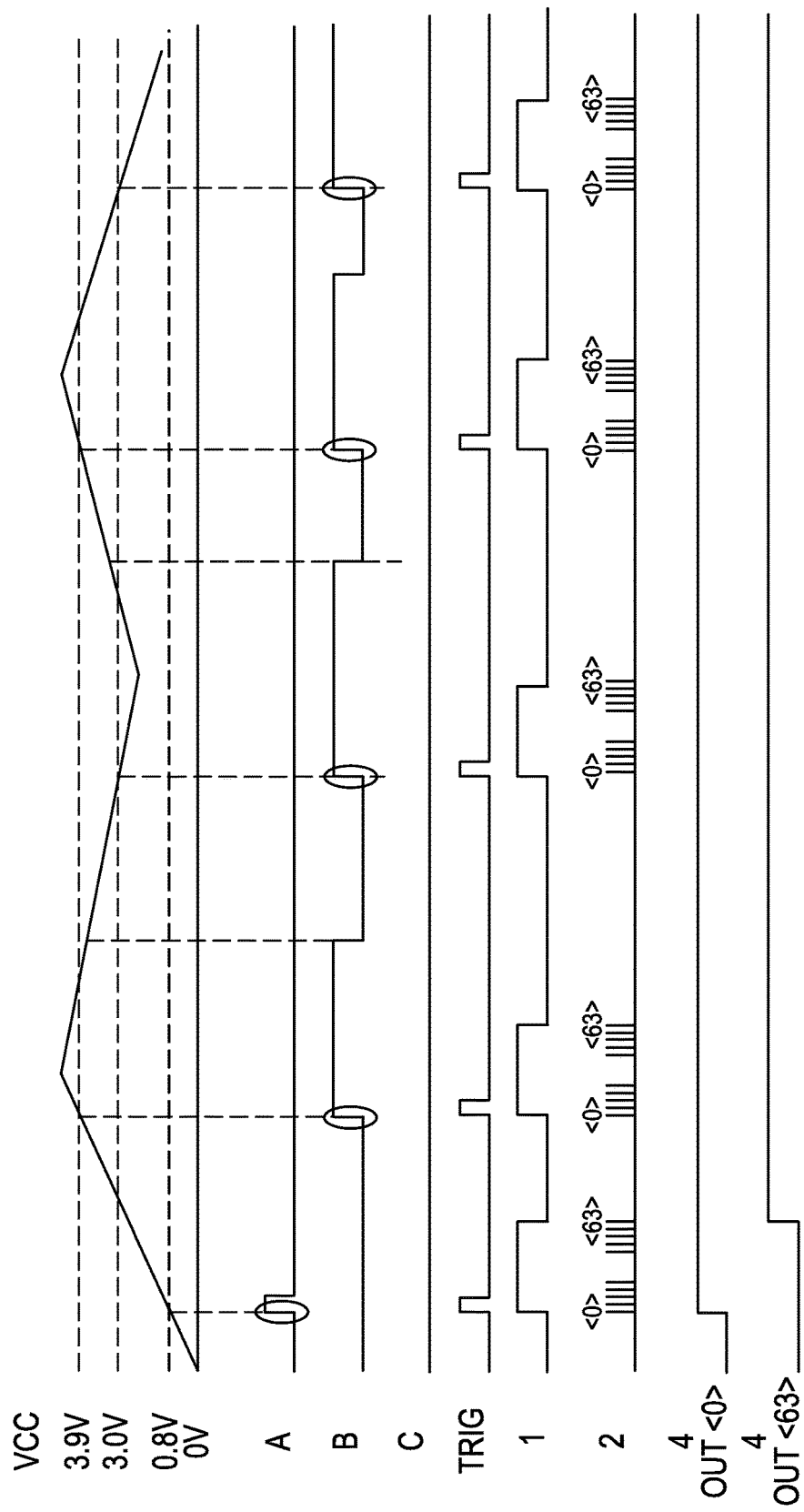
FIG. 11 is a supply voltage and trigger signal diagram for the circuit implementation of FIG. 10 when a supply voltage trigger signal is used.
Figure 12:
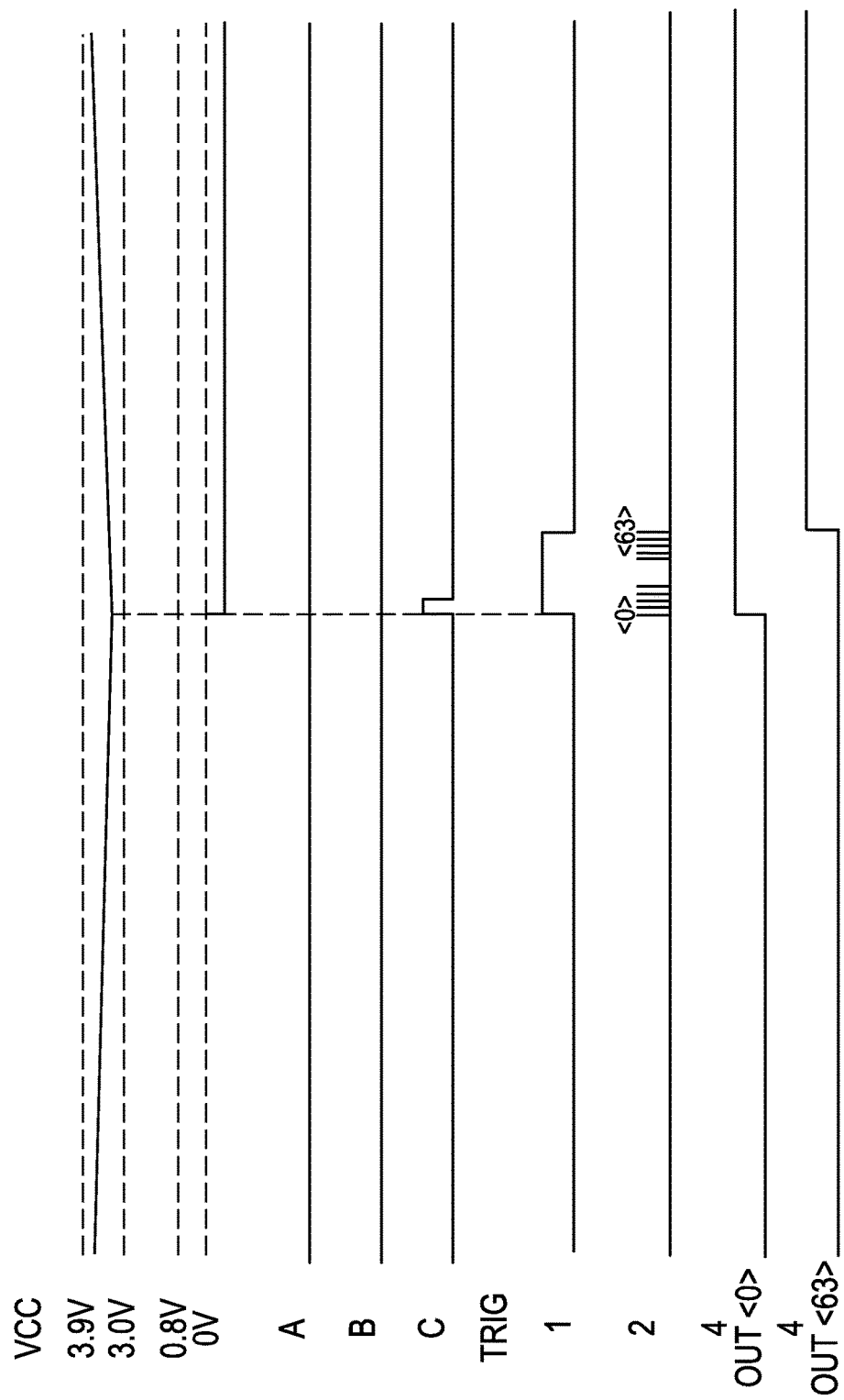
FIG. 12 is a supply voltage and trigger signal diagram for the circuit implementation of FIG. 10 when a current sense trigger signal is used.

FIGS. 11 and 12 illustrate the flow of signals through the circuit implementation illustrated in FIG. 10 during a charging and discharging cycle and during a current sense fluctuation cycle. The letters and numbers on the left of the graph correspond to locations on the circuit and show the signals passing through the components at that location during the cycle. For example, for FIG. 11, signal A is the power on/reset signal 66 which is received just as the charger is coupled with the battery. As can be seen, this results in a trigger signal 62 (TRIG) being sent to the fuse refresh circuit which is detected at location 1 and results in activating of the counter represented at location 2 which reads out all of the fuse values in the fuse array (64 of them in this case) at location 4 which are then then sent to the corresponding latches of the plurality of latches to refresh their states. Similarly, the same process is repeated during charging when the auto fuse refreshing value of 3.9 V is reached—in this case, the comparator 74 generates supply voltage trigger signal 84 which results in generation of trigger signal 62 which causes fuse refreshing circuit to refresh the values of the plurality of latches. FIG. 12 is a similar graph showing that at the inflection point of the current sense signal, the comparator 76 generates the current sense trigger signal 90 which generates trigger signal 62, detected at location 1 and which starts the process in location 2 to read out the states of each fuse of the array of fuses to location 4 where they are output to the corresponding latches of the plurality of latches.

While the use of an OR gate has been described to generate a trigger signal from either an operating trigger signal or a power on/reset trigger signal, in various implementations, the OR gate may not be used, and the trigger signal could be either the operating trigger signal or the power on/reset trigger signal by itself. Also, while implementations disclosed herein monitor both supply voltage and the current sense signal, other implementations may monitor only supply voltage or current sense signal for use in automatic fuse refreshing.

Various implementations of automatic fuse refreshing systems for use with automatically refreshable programmable battery protection systems may include structures and methods for detecting and correcting errors caused by noise and/or interference with the plurality of latches. In such systems, electrical noise or other interference alters the state of one or more of the plurality of latches, which, if left uncorrected, will change the threshold voltage being used by the battery control circuit to evaluate the performance of the battery. This could potentially place the battery in an unsafe state, one which could not be detected by the battery protection IC due to the influence of the noise changing the threshold voltage itself. Since the data values being actively used for creating the threshold voltage are stored in the latches, which are a form of rewritable, volatile memory, the ability to detect any changes in the stored values and refresh the values from the fuse array may be valuable to maintain system performance and safety over the lifecycle of the battery, rather than relying on a single writing of data to the latch or a power-consuming regularly scheduled fuse refreshing process.

Figure 13:
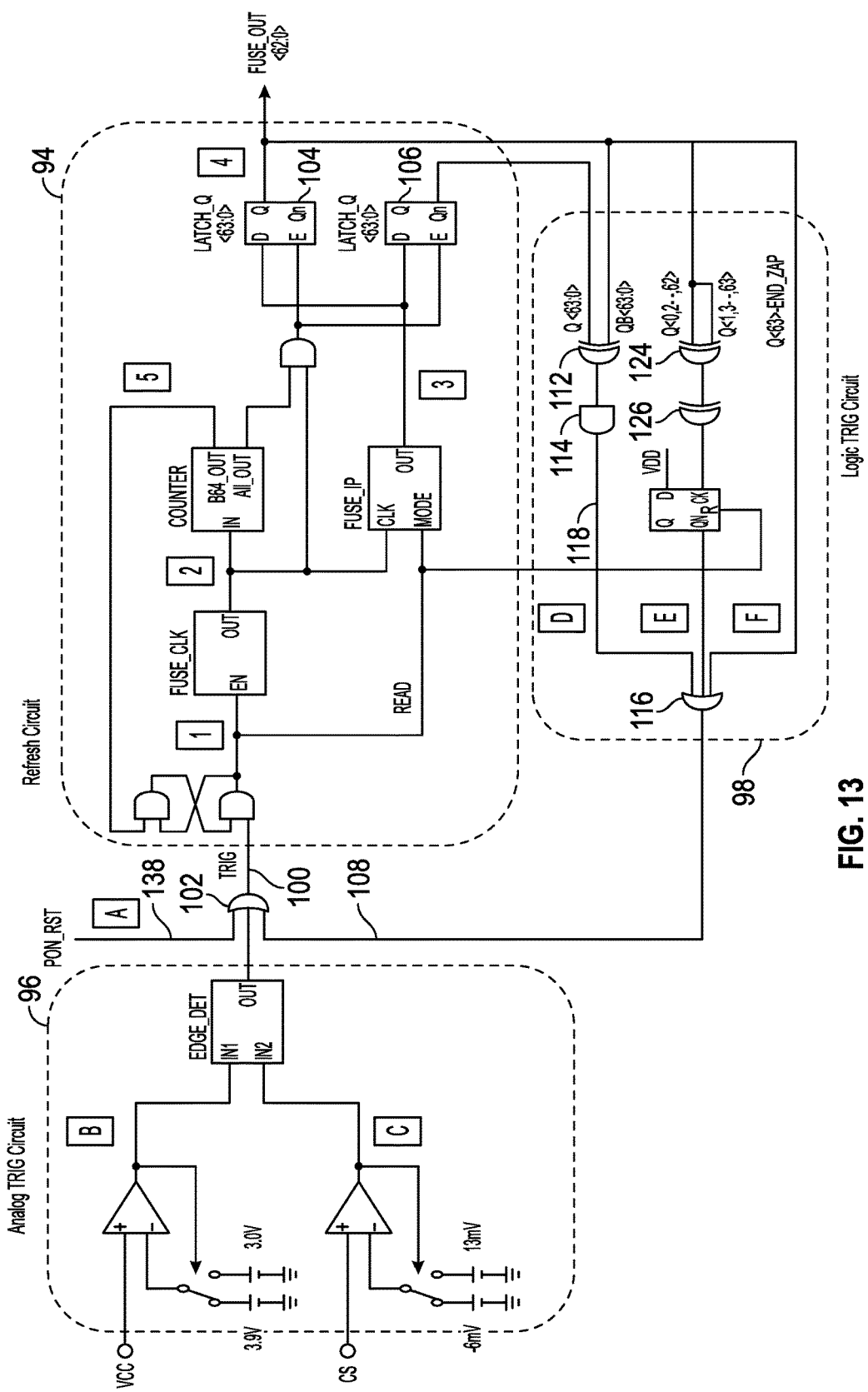
FIG. 13 is circuit diagram of another implementation of a trigger circuit and another implementations of a refresh circuit including a first latch and a first dummy latch.

Referring to FIG. 13, a circuit diagram of a fuse refresh circuit 94 is illustrated coupled to an analog trigger circuit implementation 96, and a logic trigger circuit implementation 98. These circuit implementations are included in a battery protection IC like those disclosed herein which can be coupled with a battery and various FETs. The analog trigger circuit implementation 96 is similar to the implementation illustrated in FIG. 10 and functions as described in reference to that figure and as described herein. As is illustrated, the fuse refresh circuit 94 receives a trigger signal 100 from OR gate 102 which triggers the rereading of the fuse data from the fuse array. However, in this implementation, the fuse data is not read or reread into a single set of latches, but into two sets of latches, a first plurality of latches and a second plurality of latches (dummy latches), represented here by first latch 104 and first dummy latch 106. As will be described hereafter, the term "dummy" refers to the fact that the dummy latch is a redundant latch that does not directly couple with a MOSFET coupled in parallel with a resistor, and therefore does not directly function to generate a threshold voltage. Both sets of latches 104, 106 may be seen in FIG. 14-1. The fact that the second plurality of latches 106 has its own separate independent connection to system power is indicated by the dotted line 110 surrounding the plurality of dummy latches 106.

The existence of the second plurality of latches (dummy latches) 106 allows for the use of digital logic circuits to retrieve, compare, and analyze the stored states of the first plurality of latches during operation to evaluate the effects of noise. Since the dummy latches 106 may be physically located on a different section of the battery protection IC than the first plurality of latches 104, any issues with common impedance caused by the extra latches may be reduced or eliminated. The dummy latches 106 do not influence the first plurality of latches 104 during load or charging, so the probability that the stored states of the dummy latches 106 would change at the same time the stored states of the first plurality of latches 104 would also change becomes very small. In various implementations, the timing of the two latch sets is different (i.e., they have different clocking frequencies), which further reduces the probability of synchronized simultaneous state changes between the two latch sets. As can be observed from FIG. 13, when the first plurality of latches 104 output a logic 1, the second plurality of latches 106 output a logic 0 as the output of these latches is connected to the Qn (inverted) output of the gated D latch. Accordingly the outputs/states of the two sets of latches are inverses of each other.

This aspect of the two sets of latches can be used in various logic circuits disclosed herein that act to verify and check the stored states of the two sets of latches against one another, and refresh the data values stored in both sets of latches if a deviation is detected. Logic trigger circuit 98 contains several sets of logic circuits that perform various latch state comparisons and generate a logic trigger signal that is received by OR gate 102 if a deviation is detected. Also referring to FIG. 14-2 (which shows a 4 bit set of latches), the logic trigger circuit includes a logic circuit 120 that includes plurality of exclusive OR (EXOR, XOR) gates 112, illustrated in summary form in FIG. 13 for a 64 bit set of latches.

Figures 1, 14:
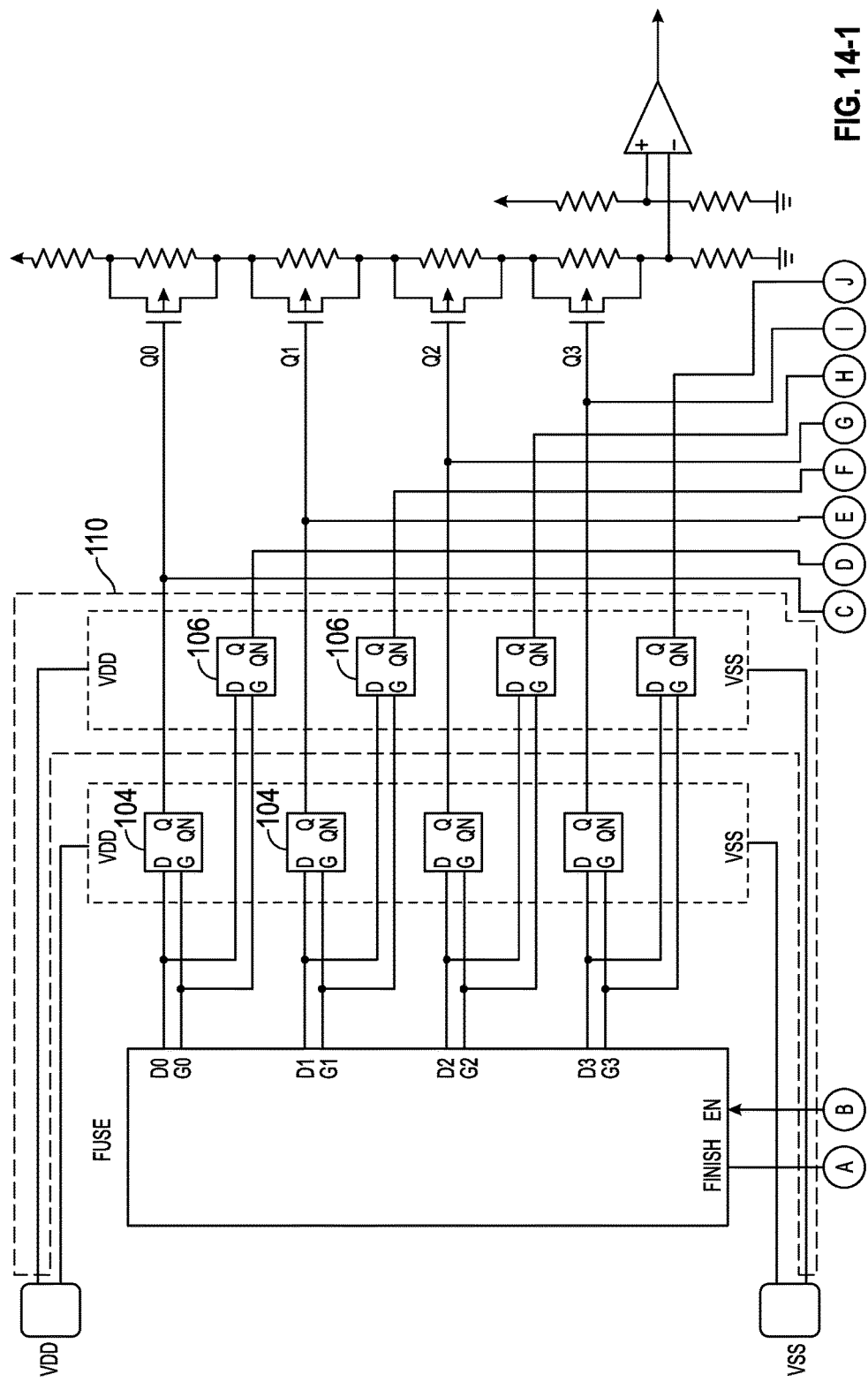
Figures 2, 14:
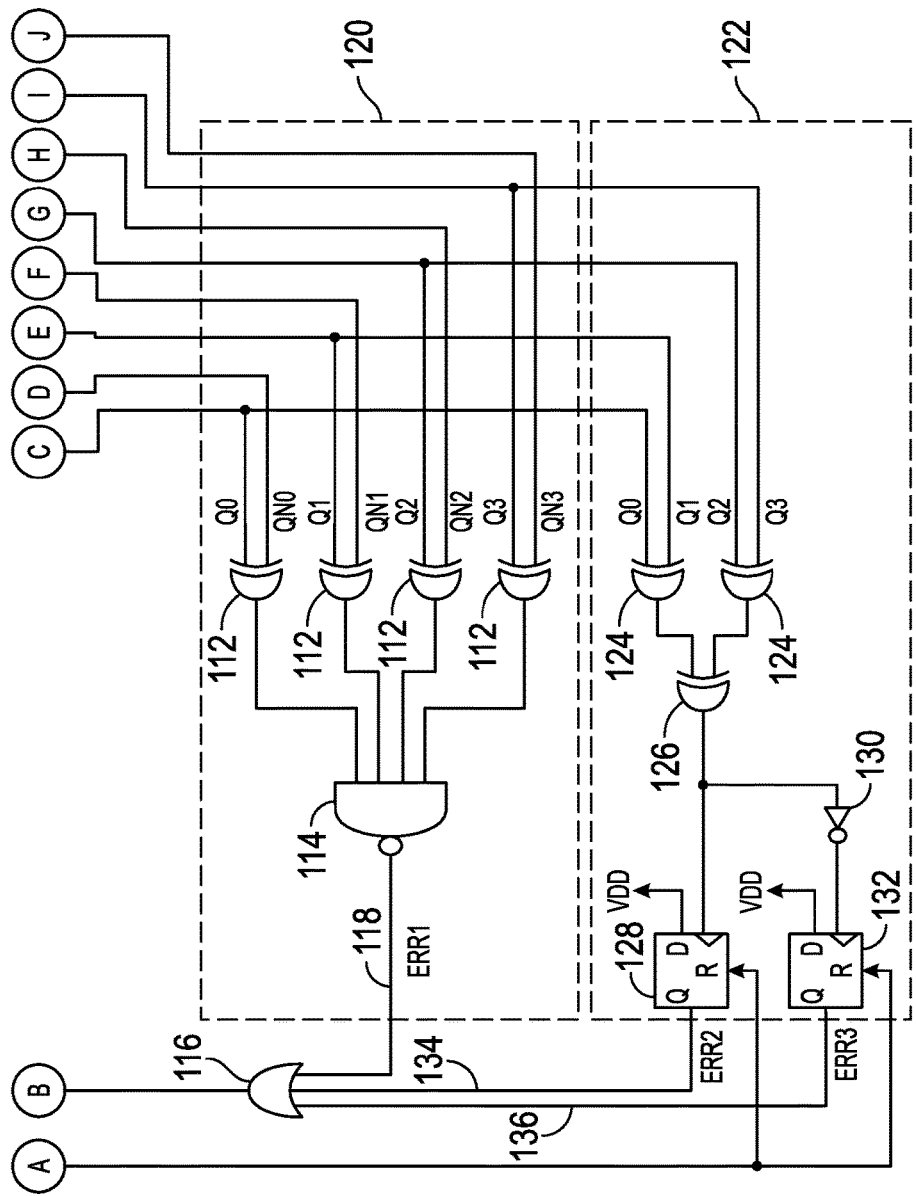

As can be seen from the wiring illustrated in FIG. 13 and the notation on the inputs to each XOR gate of the plurality of XOR gates 112 in FIG. 14-2, each XOR gate performs a comparison of the Q output of the first latch of the plurality of latches with the Qn output of the first dummy latch of the second plurality of latches and outputs to an AND gate 114 (which may be inverted in various implementations as illustrated in FIG. 14-2). The output of the AND gate 114 is provided to OR gate 116 (which may be the same OR gate 102 in various implementations, or a separate OR gate entirely, as illustrated in FIG. 13). The output of the AND gate 114 is a first logic trigger signal 118. For the output of the AND gate 114 to output a first logic trigger signal 118, one or more of the pairwise XOR comparisons of the state of the first latch with the first dummy latch (and so on, through each pair of corresponding latches) must become false (error) resulting in the XOR gate returning a 0 value. Since the truth table of the AND gate 114 requires the sum of the XOR gate values, for example, to all be 1 (or 0) in the case of no deviation, any one of the XOR gates returning a 0 value will cause the AND gate 114 to output a 0. In the case, where the AND gate 114 output is inverted, as in FIG. 14-2, the corresponding first logic trigger signal 118 will become a logic 1. The OR gate 116 then receives the first logic trigger signal 118 and then uses it to generate the trigger signal 100, which causes the fuse refresh circuit 94 to refresh the states of the first plurality of latches 104 and the second plurality of latches 106 using the states of the array of fuses.

As illustrated, a second digital logic circuit 122 is included in the logic trigger circuit 98. This circuit includes a plurality of XOR gates 124 arranged in parallel and another XOR gate 126 coupled in series with the plurality of XOR gates 124. As illustrated in FIGS. 13 and 14-2, the inputs to the plurality of XOR gates are the outputs of each latch and immediately adjacent latch in the first plurality of latches. This pairwise comparison of each set of adjacent latches by each XOR gate in the plurality of XOR gates 124 is fed into XOR gate 126. The effect of combining the plurality of XOR gate outputs into the XOR gate 126 is to determine whether the sum of the states of the first plurality of latches is even or odd. If even, the XOR gate 126 will output 0, if odd, the XOR gate 126 will output a 1 (or vice versa, depending on the nature of the gates). The output of XOR gate 126 is received as a clock signal by a first D flip flop 128 and by an inverter 130 coupled to the clock signal of a second D flip flop 132. The effect of coupling the output of the XOR gate 126 to the clock signals of the first D flip flop 128 and second D flip flop 132 is that if a change in the output of the XOR gate 126 is detected (1 to 0 or 0 to 1), the first D flip flop 128 will send an output out as a second logic trigger signal 134 (if the change is from 0 to 1). If the change in the output of the XOR gate 126 is from 1 to 0, the second D flip flop 132 (via the inverter 130) will be clocked and output a second logic trigger signal 136. The second logic trigger signals 134, 136 are received by OR gate 116 and used to generate a logic trigger signal 108.

Logic trigger signal 108 will also be triggered if a change of state of the fuse in the fuse array that records whether the fuse array has been trimmed or not is changed. In FIG. 13, this change of state is referred to as END ZAP. This change of state is set after completion of the last test during test mode of the device prior to shipment, and is set to a 1 value. In the implementation illustrated in FIG. 13, the last fuse of the fuse array Q<63> is used to store the END ZAP state. If the value of the corresponding latch changes from 1 to 0, this will be detected by the logic trigger circuit 98 through the OR gate 116, generating the logic trigger signal 108 and signaling a refreshing of the plurality of latches 104 and 106.

The fact that the sum of the of states of the first plurality of latches has changed from even to odd or odd to even indicates that noise has affected at least one value in the plurality of latches, and, if the first digital logic circuit 120 does not indicate that the pairwise XOR comparison of the states of the first and second plurality of latches have changed, indicates that the noise has affected both values of the first plurality and second plurality of latches at the same time. This kind of simultaneous error could not be detected using the first logic circuit 120, but requires monitoring whether the sum of the states of the plurality of latches has changed from even to odd (at one or more bit values).

The effect of the first logic circuit 120 and second logic circuit 122 in combination with the logic trigger circuit 98 on the states of the various latches can be observed in FIGS. 15A-D and 16A-D. FIGS. 15A and 16A illustrate the initial state of the first plurality of latches (Q) and the second plurality of latches (Qn) on power on. As in various implementations previously described (and illustrated by Power on/Reset signal 138 in FIG. 13), the fuse refresh circuit 94 automatically reads the data from the fuse array following triggering at power on (which is a 4 bit fuse array in this example). The result after Fuse reading is illustrated in FIGS. 15B and 16B. Noise then changes the latch of the first plurality of latches corresponding to bit 2, flipping it from 1 to 0. The effect of the XOR gate comparisons performed on pairs of corresponding first latches and first dummy latches shows that the XOR comparison has shifted from 1 to 0. In response, the logic trigger circuit 98 sends a logic trigger signal 108 to fuse refresh circuit 94, and the fuse states are reread into the first plurality of latches and second plurality of latches, as illustrated in FIG. 15D. The same result and response would take place if it was the value of the first dummy latch that changed, or more than one latch value changed.

FIG. 16C shows the situation where both the value of the first latch and the first dummy latch both change under the effect of noise and both change to opposite values (from 1, 0 to 0, 1). As can be observed, the XOR gate comparisons done by the first logic circuit 120 cannot detect the change. However, the second logic circuit's 122 adding of the states of the first plurality of latches and detecting that the sum switched from odd originally to even after the noise would allow the logic trigger circuit 98 to detect the change and generate the logic trigger signal 108 to the fuse refresh circuit 94. The result of the fuse refresh circuit 94 refreshing the states of both the first plurality of latches and the second plurality of latches can be seen in FIG. 16D, which corrected the errors in both sets of latches.

Use of a second plurality of latches in various system implementations may be referred to as a first countermeasure to preventing and detecting errors in the latched data. The logic of the first logic circuit 120 that does pairwise XOR comparisons of the latched data between the first plurality of latches and the second plurality of latches may be referred to as a second countermeasure. The logic of the second logic circuit 122 that evaluates the sum of the states of the first plurality of latches to determine whether two adjacent latches of the first plurality latches and the second plurality of latches have had their values flipped may be referred to as a third countermeasure. Various implementations may contain various combinations of the first, second, and third countermeasures. For example, implementations may include the first and second countermeasures or the first and third countermeasures. A wide variety of possible implementations may be constructed using the principles disclosed herein.

In places where the description above refers to particular implementations of programmable battery protection systems and implementing components, sub-components, methods and sub-methods, it should be readily apparent that a number of modifications may be made without departing from the spirit thereof and that these implementations, implementing components, sub-components, methods and sub-methods may be applied to other programmable battery protection systems.

What is claimed is:

1. An automatically refreshable programmable battery protection system comprising:
    a battery;
    at least two field effect transistors (FETs) coupled with the battery;
    a battery protection integrated circuit (IC) coupled with the FETs wherein the battery protection IC comprises:
        an array of fuses;
        a first plurality of latches coupled with the array of fuses;
        a second plurality of latches coupled with the array of fuses; and
        a comparator coupled with the first plurality of latches;
    wherein the array of fuses, the first plurality of latches, and the second plurality of latches are coupled with a fuse refresh circuit coupled with an analog trigger circuit and a logic trigger circuit, the fuse refresh circuit configured to refresh the states of the first plurality of latches and the second plurality of latches using states of the array of fuses in response to receiving one of an operating trigger signal generated by the analog trigger circuit and a logic trigger signal generated by the logic trigger circuit; and
    wherein the first plurality of latches are used to generate a threshold voltage that is provided to the comparator; and
    wherein the fuse refresh circuit is configured to refresh the states of the first plurality of latches and the second plurality of latches using states of the array of fuses in response to receiving a power on/reset signal from the battery.

2. The system of claim 1, wherein the logic trigger circuit comprises a plurality of XOR gates coupled with an AND gate coupled with an OR gate, where the OR gate is configured to generate the logic trigger signal to the fuse refresh circuit in response to receiving a first logic trigger signal from the AND gate.

3. The system of claim 2, wherein each of the plurality of XOR gates are coupled with a first latch of the first plurality of latches and a corresponding first dummy latch from the second plurality of latches and is configured to compare a state of the first latch with a state of the first dummy latch and output the result to the AND gate.

4. The system of claim 3, wherein if any XOR gate of the plurality of XOR gates returns a null value, the AND gate generates the first logic trigger signal.

5. The system of claim 1, wherein the logic trigger circuit comprises a plurality of XOR gates where each of the plurality of XOR gates is coupled to a first latch and a second immediately adjacent latch of the first plurality of latches, the outputs of the plurality of XOR gates are coupled to an XOR gate, and the output of the XOR gate is coupled to a first D flip flop and to a inverter coupled with a second D flip flop, wherein the output of the first D flip flop and the output of the second D flip flop are coupled with an OR gate coupled to the fuse refresh circuit and the OR gate is configured to generate the logic trigger signal.

6. The system of claim 5, wherein during operation, if the XOR gate outputs a 0, this indicates that the comparison of the states of the first plurality of latches by the plurality of XOR gates shows that a sum of the states of the first plurality of latches has changed from an even number to an odd number, the second D flip flop generates a second logic trigger signal and outputs the result to the OR gate which then, in response, generates the logic trigger signal.

7. The system of claim 5, wherein during operation, if the XOR gate outputs a 0, indicating that the comparison of the states of the first plurality of latches by the plurality of XOR gates shows that a sum of the states of the first plurality of latches has changed from an odd number to an even number, the first D flip flop generates a second logic trigger signal and outputs the result to the OR gate which then, in response, generates the logic trigger signal.

8. The system of claim 1, wherein the plurality of latches are gated D latches and the first plurality of latches and second plurality of latches are located in separate portions of the battery protection integrated circuit (IC).

9. The system of claim 1, wherein the first plurality of latches are coupled with a plurality of metal oxide semiconductor field effect transistors (MOSFETs) and where the plurality of MOSFETs are coupled in parallel with a plurality of resistors coupled to the comparator.

10. A battery protection integrated circuit (IC) comprising:
    an array of fuses;
    a first plurality of latches coupled with the array of fuses;
    a second plurality of latches coupled with the array of fuses;
    a comparator coupled with the plurality of latches and with a battery control circuit;
    a fuse refresh circuit coupled with a trigger circuit and coupled with the array of fuses, the first plurality of latches, and the second plurality of latches;
    wherein the trigger circuit comprises an analog trigger circuit and a logic trigger circuit; and
    wherein the logic trigger circuit comprises a plurality of XOR gates where each of the plurality of XOR gates is coupled to a first latch and a second immediately adjacent latch of the first plurality of latches, the outputs of the plurality of XOR gates are coupled to an XOR gate, and the output of the XOR gate is coupled to a first D flip flop and to an inverter coupled with a second D flip flop.

11. The IC of claim 10, wherein the first plurality of latches are coupled with a plurality of metal oxide semiconductor field effect transistors (MOSFETs) which are coupled in parallel with a plurality of resistors coupled to the comparator.

12. The IC of claim 10, wherein the plurality of latches are gated D latches and the first plurality of latches and second plurality of latches are located in separate portions of the IC.

13. The IC of claim 10, wherein the logic trigger circuit comprises a plurality of XOR gates coupled with an AND gate coupled with an OR gate.

* * * * *